United States Patent [19]

Euler

[11] Patent Number: 4,890,326

[45] Date of Patent: Dec. 26, 1989

[54] METHOD FOR COMPRESSING DATA

[75] Inventor: James A. Euler, Knoxville, Tenn.

[73] Assignee: Rubiyat Software, Inc., Knoxville, Tenn.

[21] Appl. No.: 163,658

[22] Filed: Mar. 3, 1988

[51] Int. Cl.$^4$ .......................... G01L 3/02; H03M 7/38
[52] U.S. Cl. ........................................ 381/35; 381/31; 341/51; 341/63
[58] Field of Search ...................... 341/51, 56, 63, 67; 364/135, 821; 381/30, 31, 35

[56] References Cited

U.S. PATENT DOCUMENTS

| | | | |
|---|---|---|---|
| 3,660,837 | 5/1972 | Chinal | 255/155 |
| 3,681,756 | 8/1972 | Burkhard et al. | 381/31 |
| 3,736,412 | 5/1973 | Wright | 235/155 |
| 3,766,456 | 10/1973 | Aaron et al. | 340/347 |
| 3,913,093 | 10/1975 | de Vincentiis | 340/347 |
| 3,921,210 | 11/1975 | Halpern | 360/40 |
| 4,003,041 | 1/1977 | van Durren et al. | 340/347 |
| 4,216,354 | 8/1980 | Esteban et al. | 381/31 |
| 4,342,027 | 7/1982 | Hanson | 340/347 |
| 4,441,095 | 4/1984 | Widmer et al. | 340/347 |
| 4,546,342 | 10/1985 | Weaver et al. | 341/67 |
| 4,802,221 | 1/1989 | Jibbe | 381/30 |
| 4,815,134 | 3/1989 | Picone et al. | 381/31 |
| 4,833,718 | 5/1989 | Sprague | 381/35 |

Primary Examiner—William M. Shoop, Jr.
Assistant Examiner—Gary J. Romano
Attorney, Agent, or Firm—Luedeka, Hodges & Neely

[57] ABSTRACT

A method for compressing and decompressing voice data enables efficient voice storage on small computers. Analog voice data is converted to digital voice data and the difference jumps between adjacent numbers in the digital voice data are measured. In the preferred embodiment, if the value of the jump is within the range +2 to −2, then a code value is assigned to that jump from zero to four where the code value equals the jump value plus two. If the jump value is outside the range, a jump is normally assigned a code value of five. Three adjacent codes are compressed to one code using the formula:

Compression number = 6×[6×(code 3)+code 2]+code 1 and at least this compression number is stored. If one or two of the code values in a group of three code values has a value of five, the actual jump value is stored after the compression number. However, if all jumps in a group of three have an absolute value of greater than two and less than twenty-three, then a second compression option is chosen in which a compression word is generated that will identify the three jump values, and the compression word is stored as part of the compressed data. After the aforementioned compression steps, further compression is performed to eliminate repetitious zeroed jumps. Decompression is accomplished by reading the compressed data, recognizing the compression numbers and compression words and determining the codes and jumps from the compression numbers, the compression words, and the compressed data itself.

8 Claims, 4 Drawing Sheets

| SAMPLE # | (BINARY NUMBER) SAMPLE VALUE | JUMP | ASSIGNED CODE | COMPRES'D BYTES (HEXADECIMAL) | COMPRES'D BYTES (BASE 10) |
|---|---|---|---|---|---|
| 1 | 01001010 | NONE | NONE | 4A H | 74 |
| 2 | 01001010 | 0 | 2 | (SAMPLE VALUE) | (SAMPLE VALUE) |
| 3 | 01001010 | 0 | 2 | | |
| 4 | 01001010 | 0 | 2 | 56 H | 86 |
| 5 | 01001010 | 0 | 2 | | |
| 6 | 01001010 | 0 | 2 | | |
| 7 | 01001010 | 0 | 2 | 56 H | 86 |
| 8 | 01001010 | 0 | 2 | | |
| 9 | 01001001 | −1 | 1 | | |
| 10 | 01001000 | −1 | 1 | 2C H | 44 |
| 11 | 01000110 | −2 | 0 | | |
| 12 | 01000110 | 0 | 2 | | |
| 13 | 01000110 | 0 | 2 | 54 H | 84 |
| 14 | 01000110 | 0 | 2 | | |
| 15 | 01000111 | +1 | 3 | | |
| 16 | 01001000 | +1 | 3 | 80 H | 128 |
| 17 | 01001010 | +2 | 4 | | |
| 18 | 01001010 | 0 | 2 | | |
| 19 | 01001010 | 0 | 2 | 58 H | 88 |

Fig. 3

| SAMPLE # | SAMPLE VALUE | JUMP BASE 10 | CODES (BASE 10) | COMPRES'D DATA (BASE 10) | COMPRES'D DATA (HEXADECIMAL) |
|---|---|---|---|---|---|
| 1 | 01001010 | NONE | NONE | 74 | 4A H |
| 2 | 01000010 | −8 | 5 | | |
| 3 | 01000010 | 0 | 2 | | |
| 4 | 00111000 | −10 | 5 | 197, 66, 56 | C5 H, 42 H, 38 H |
| 5 | 00110000 | −8 | 14 | | |
| 6 | 01000010 | +18 | 35 | | |
| 7 | 01001010 | +8 | 25 | 218, 41414 | DA H, A1C6 H |
| 8 | 01001010 | 0 | 2 | | |
| 9 | 01001010 | 0 | 2 | | |
| 10 | 01001010 | 0 | 2 | 74 | 56 H |

*Fig. 4*

| FIRST COMPRESSED BYTES (HEX) | SECOND COMPRESSED BYTES (HEX) |
|---|---|
| 4A H | 4A H |
| 56 H | D8 H |
| 56 H | 04 H |
| 56 H | |
| 56 H | |
| 80 H | 80 H |
| 58 H | 58 H |

*Fig. 5*

METHOD FOR COMPRESSING DATA

FIELD OF THE INVENTION

The present invention relates to data compression and particularly relates to a data compression method for voice data that may be efficiently utilized on a small computer.

BACKGROUND AND SUMMARY OF INVENTION

One purpose of the present invention is to enable small children in the age range of about 3-7 to communicate and interact with a computer under a substantially nonstructured format. The child is not given detailed instructions on using the computer but, instead, he or she is allowed to explore and discover how to operate it. For a young child to receive an appropriate level of feedback from the computer, the computer should talk to the child and provide it with spoken feedback as well as the usual visual output of the computer.

The types of computers that are typically available to small children are small computers with limited memory. Thus, in order to store the needed voice responses in a small computer memory, a simple and efficient voice compression method is needed. For this particular application, so long as the quality of the voice reproduction is good, the primary consideration for this application is efficient processing and utilization of a minimum amount of memory for storing both the program and the data.

The present invention takes advantage of the smooth transitions and repetitive nature of most speech. The rate of change of most speech is relatively slow so that when it is sampled at a frequency of 10,000 samples per second, the difference jumps between each of the samples are relatively small. In most cases, the voice data may be sampled and desensitized until the majority of the jumps have an absolute value of two or less, and yet the quality of the data will remain sufficiently high so that the voice may be reconstructed and easily understood by a child. By measuring and storing the jumps between data points, the voice may be compressed. In the preferred embodiment, a single byte is used to store three jumps by calculating a single compression number from the three jumps. In the decompression mode, the single compression number is used to reconstruct the value of the three jumps and they are used to reconstruct the voice. In order for a single compression number to represent three jumps, each jump must be within a set range. In a group of three, if one or two jumps falls outside the range, the compression number when decoded (decompressed) will reflect which of the jumps were out of range. The values of these jumps are then stored immediately after the compression number in the compressed data.

If all three jumps in a group fall outside a first selected range but within a second selected range, a special code number is stored to indicate this fact, but instead of storing three numbers after the code number which would reflect the actual value of the three jumps, a two byte compression word is stored after the compression number. This compression word requires two bytes, but jumps outside of the first selected range may be coded into this word. For example, compression numbers can identify three jumps that fall within a range of +2 to −2, while a compression word can identify three jumps that fall within a range of +22 to +3 and −3 to −22. The range of +2 to −2 is not identified by the compression words since this range is covered by compression numbers. After compression, using compression numbers and compression words, the compressed data is again compressed by looking for periods of time in which there was no change in the voice signal. In such cases, the jumps would equal zero and a compression number of "56 H" (H indicates hexadecimal) would indicate three zero jumps. If two or more compression numbers of "56 H" are found, they are replaced by the code value "DA H" to indicate the repetition of the number "56 H" and data following "DA H" would indicate how many compression numbers of a value "56 H" were found in the compressed data string.

BRIEF DESCRIPTION OF THE DRAWINGS

The attached Figures are briefly described as follows:

FIG. 3 is a table showing the samples taken from the signal shown in FIG. 2 and illustrating compression of the data;

FIG. 4 is a table showing another set of sample data and illustrating an alternate compression scheme;

FIG. 5 is a table illustrating a second compression occurring after the first compression.

DETAILED DESCRIPTION

In accordance with the method of the present invention, in order to compress and store a voice signal, it is first sampled at a frequency of 10,000 times per second and the amplitude of each sample is recorded as an 8-bit number. This string of digital numbers then represents the voice data and to play back the voice, the digital numbers are converted back to an analog signal.

Figure 1:
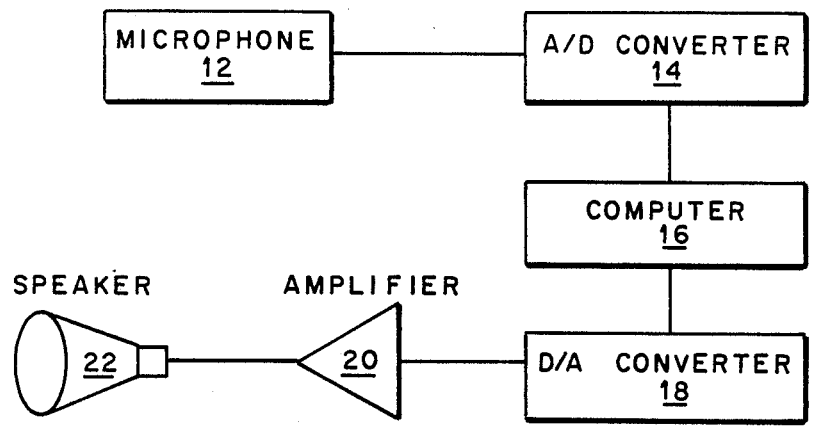
FIG. 1 is a block diagram of a computer system for receiving and transmitting voice data in which the computer stores the data in compressed form.

FIG. 1 illustrates a computer system 10 that includes a microphone 12 that transmits voice data to an analog to digital converter 14 and then to computer 16. The computer 16 also transmits recorded voice data through digital to analog converter 18 and amplifier 20 to a speaker 22. The computer system 10 is well known in the art and the choice of computer system used to implement the invention is not considered to be a part of the invention. Those skilled in the art will also be familiar with how to input, store, transfer, manipulate and output data with a computer. These details are considered well known and are not set forth herein.

Once the digital numbers are determined, compression begins. The first step of the compression method is to desensitize the data. This is done by dividing all of the numbers by some power of two, usually the second or first power. The amount of decompression is chosen so that most of the samples create jumps within a range of +2 to −2 from adjacent samples and, usually, the second or first power of two is sufficient to achieve the desired amount of decompression.

The value of the first number in the digital voice data string is stored in the compressed data to provide a beginning point, and the difference between the first number and the second number is measured. A code is normally assigned to this "jump" between the first and second numbers, and, then, the next two jumps are determined by measuring the difference between the second and third number and between the third and fourth number, respectively. If any one of these three jumps is within the range of +2 to −2, a first compression option is performed in the following manner. If the first jump is "−2", a code "0" is assigned. If the jump is "−1", the code is "1". If the jump is "0", the code is "2". If the jump is "+1", the code is "3", and if the jump is "2", the code is "4". For any jumps of less than negative two or greater than plus two, the jump is assigned a code value of "5". After three successive jumps and codes are determined, a formula is used to develop a single number (herein referred to as a compression number or a compression byte) which can be used to determine the identity of the three codes. The formula is as follows:

*Compressed byte*=[(6×*Code* 3+*Code* 2)×6]+*Code* 1.

Figure 2:
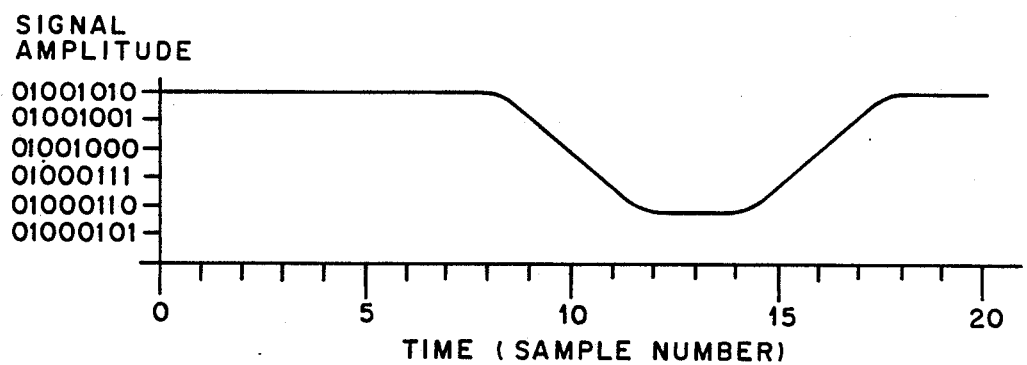
FIG. 2 is a chart showing a signal being sampled by an A/D converter.

FIGS. 2 and 3 illustrates the sampling and compression described above. FIG. 2 is a graph of a signal, such as a voice analog signal, that is sampled 19 times. FIG. 3, column 2, shows the samples as a binary number and column 3 shows the jumps between samples. Column 4 shows the codes assigned to the samples and then Columns 5 and 6 show the compressed bytes that are generated from the codes. Columns 5 and 6 are identical except Column 5 shows hexadecimal numbers (base 16) and column 6 shows base 10 numbers.

In order to decompress the compressed byte and determine from the compressed byte what the original three codes are, the compressed byte is first divided by six. The division will produce a quotient plus a remainder, and the remainder will be code 1. The whole number quotient that is found by the first division (without the remainder) is divided again by six which will result in a second whole quotient plus a remainder. The second remainder will be code 2. The second whole quotient is code 3. Thus, the decompression will produce all three original codes.

In the discussion above, there is an explanation of how codes are generated from jumps, how a compressed byte is generated from three codes, and how the compressed byte is decompressed to regenerate the three codes. It will be appreciated that if all three codes were less than five, then the compressed byte contains all of the information necessary to regenerate the original jumps and the original signal. That is, since the value of the first digital number is stored and since all three codes may be determined from the compressed byte, the value of the first three numbers in the original digital voice data string may be determined by first determining the value of the three jumps corresponding to the three codes and adding these jumps to the first number in the compressed data to determine the next three numbers in the data string. All successive numbers in the digital voice data could be determined in the same manner provided all jumps are within the range of +2 to −2 meaning that no code 5's are encountered.

However, if any of the codes are five, more information will be needed in order to determine the value of the original number in the digital voice data. Thus, in accordance with the first compression option of the present invention, if one or more of the three codes is "five" the actual value of the jump associated with the particular code five is stored immediately behind the compressed byte. When decompression is performed and a compressed byte is determined to include a "code five", it is known that the next number in the compressed data will represent the actual value of the jump corresponding to the particular code five position. If two of the codes are "five" it will be known that the next two numbers in the compressed data represent the actual value of the two jumps corresponding to the code fives, and if all three of the codes are "five", it will be known that the next three numbers correspond to the actual values of all three jumps of the group. These actual values of jumps are stored behind the compressed byte in the same order as the code. For example, if code 1 and code 3 have a value of "five", then the actual value of these two jumps will be stored in the same order (1 then 3) after the compressed byte so that the next number will correspond to code 1 and the following number will correspond to code 3.

From the discussion above, it will be appreciated that if all three codes were "five" then the first compression option will actually result in an expansion of the data rather than a compression of the data. In other words, if all three codes are "five" this first compression option will replace three bytes in the digital voice data with four bytes in the compressed data. In one embodiment, this expansion is simply tolerated since it occurs infrequently, but in another embodiment, a second compression option is used to eliminate the expansion.

In accordance with this latter embodiment, when three jumps of a group are outside of the range of +2 to −2, the digital voice data is checked to see if all three of the jumps are between +22 and 22. If they are, the code value of "DA H" (H means hexadecimal) is stored in the compressed data to indicate that the next two bytes represent a sixteen bit word which is coded with the formula:

*Compressed word*=[(40×*Code* 3+*Code* 2)×40]+*Code* 1.

Each of the three codes above are determined using the formula:

*Code*=*Data*+17 *for positive data.*

*Code*=*Data*+22 *for negative data.*

When it is desired to decompress the compressed data created by the second compression option, the number "DA H" indicates that the compression was achieved by the second compression option using a multiplier of forty and that the next two bytes represent a sixteen bit word. That word is divided by forty and the remainder of the division is recognized as code 1. The whole quotient of the first division is divided by forty again, and the second remainder of the second division is recognized as code 2 while this second whole quotient derived from the second division is recognized as code 3. If the code value is nineteen or less, twenty-two is subtracted from the code value to determine the jump value. If the code value is twenty or more, seventeen is subtracted from the code value to determine the jump value.

If any one of the three jumps in a group falls outside the range of +22 to −22, the first compression option is used and the resultant expansion is tolerated since it occurs very infrequently.

FIG. 4 illustrates ten samples and compression by both options described above. Samples 2, 3 and 4 are compressed according to the first described option and samples 5, 6 and 7 are compressed using the second described option. Samples 8, 9 and 10 are compressed using the first option.

After all of the digital voice data has been converted to compressed data as described above, another compression is performed. The data is scanned looking for a byte having the number "56 H". "56 H" is the number that will be generated by the first compression option when all of the codes are "two" indicating that all jump values were "zero". If two "56 H's" are found, the first one is replaced with "D8 H" and a count is begun of the number of "56 H's". This count is placed in the byte following "D8 H". If the count is less than "FF H", the grouping is finished and the remainder of the compressed data is scanned for "56 H's". However, if the count is more than "FF H", the byte after "D8 H" is filled with "FF H" and the count is continued. The bytes following "D8 H" are repetitively filled with "FF H" as is necessary to indicate the correct number of repetitive "56 H's". After a string of "FF H's", the next following byte will indicate the last number in a count of "56 H's". For example, during decompression, when a "D8 H" is encountered, and a "FF H" follows "D8 H", it is known that the number of "56 H's" is greater than "FF H" and the next byte will indicate the number of "56 H's" in excess of "FF H" that are encountered in the original compressed data. If another "FF H" is encountered, it is known that the number of "56 H's" was greater than "FF H" plus "FF H" and so on until the number of "56 H's" has been determined. For example, if 514 bytes have a value of "56 H" in a row, the codes which would appear in the compressed data are as follows: "D8 H", "FF H", "FF H", "04 H", [next code].

FIG. 5 illustrates this second compression. Four 56 H numbers were crested during the first compression as shown in column 1, and these four numbers are replaced with D8 H and 04 H as shown in column 2.

Figure 6:
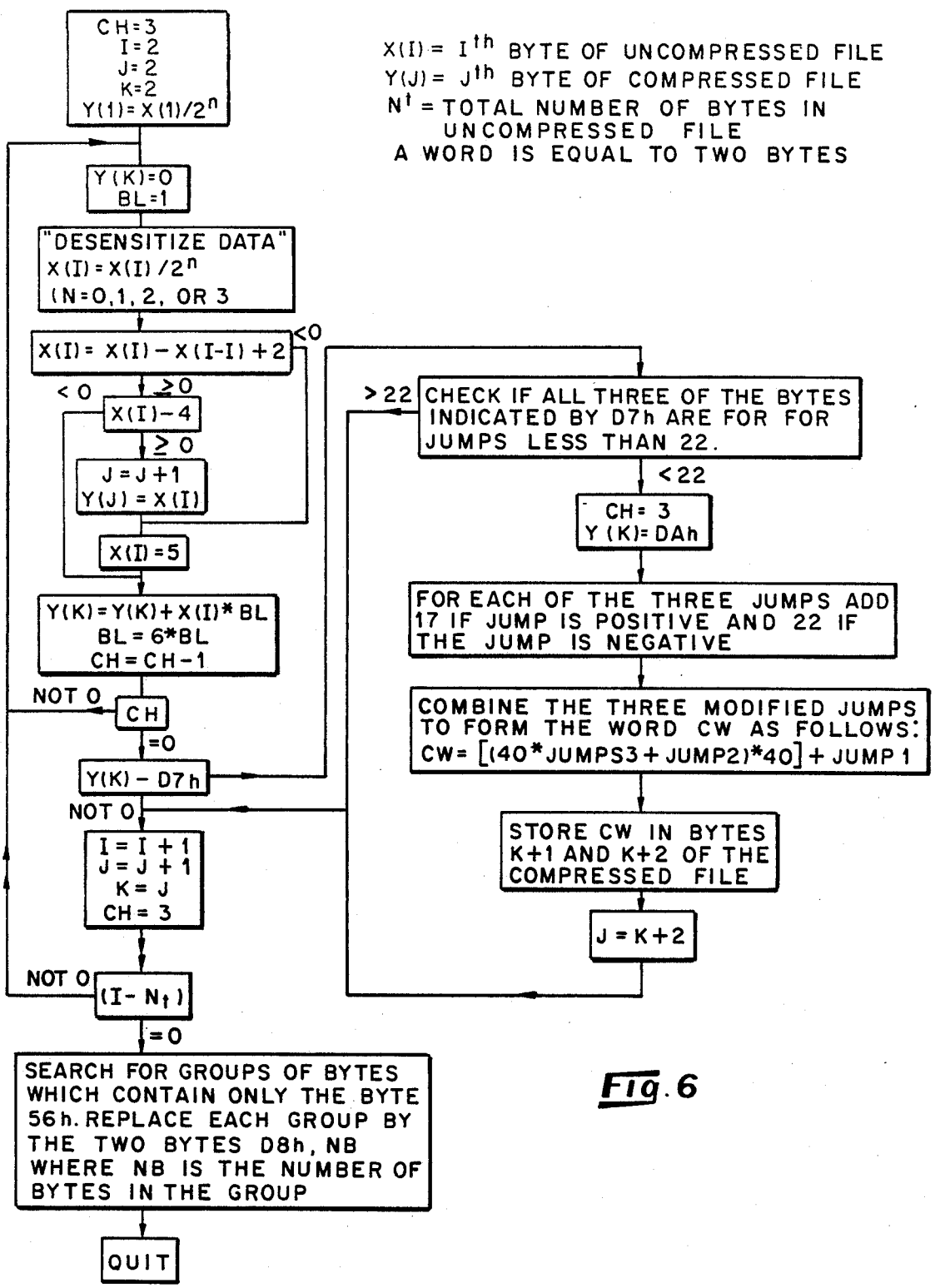
FIG. 6 is a flow chart illustrating the operation of one embodiment of the method of the present invention.

FIG. 6 is a flow chart illustrating an embodiment of the invention selectively utilizing three compression options as described above In the discussion above, after each major compression step was explained, the corresponding decompression method was also discussed. This order was chosen to facilitate understanding of the compression method, but it will be understood, however, that all compression steps take place before any decompression is performed, and the overall preferred method of the invention may be summarized as stated below. The analog voice data is converted to digital voice data and is desensitized. The first number of the digital voice data is stored and the jumps between all remaining numbers in the digital voice data are determined. The data is analyzed in groups of three and, in a group of three jumps, if any one jump falls within the range of +2 to −2 or if any one of the three jumps are outside of the range of +22 to −22, the first compression option is used to generate codes, compression bytes and compression data. If all three jumps are outside the range +2 to −2 but within the range of +22 to −22, the second compression option is performed to determine the codes and a compressed word. After all of the digital voice data has been operated on by the first or second compression options, the compressed data is further compressed by substituting repetitive "56 H's", which indicate that all three jumps in a group are "zero", with the number "D8 H" followed by data indicating the number of times that "56 H" has been repeated in the original compressed data.

To decompress, it is recognized that the first number in the compressed data represents the magnitude of the first sample of the voice data, and this magnitude value provides a starting place. If the next number encountered in the compressed data is less than "D8 H", then the data has been compressed using the first compression option, and it will be decompressed accordingly. If a "D8 H" is encountered at a position where a compressed byte would normally appear, the numbers following "D8 H" are known to indicate the number of times "56 H" has been encountered in the compressed data and, thus, indicates the number of zero jumps in the voice data. If the number "DA H" is encountered at a position where a compression byte would normally appear, it is known that the data has been compressed using the second compression option, and it is decompressed accordingly.

In another embodiment of the invention, it may be desired to eliminate the second compression option, and in such case the first compression option is always used even when it results in expansion rather than compression. When decompressing, the same method as described above is used except that all decompression is conducted as described with respect to the first compression option. Since the second compression option is not used, the number "DA H" will never be encountered.

Although the above two described embodiments are preferred, it will be understood that the invention is capable of modifications and substitutions without departing from the scope of the invention as defined by the appended claims.

What is claimed is:

1. A method for compressing and decompressing analog voice data for storage in a computer memory comprising:
   converting the analog voice data to digital voice data comprising a series of digital numbers;
   determining the difference jumps between adjacent numbers in the digital voice data;
   assigning a code value to each jump;
   grouping the codes into groups of adjacent codes and calculating a single compression number for each group that is unique for any combination of code values in the group;
   storing at least the compression numbers as compressed data; and
   reading the compressed data and selectively utilizing the stored compression numbers to determine codes of each group.

2. A method for compressing and decompressing analog voice data for storage in a computer memory comprising:
   converting the analog voice data to digital voice data comprising a series of digital numbers;
   determining the difference jumps between adjacent numbers in the digital voice data;
   assigning a code value to each jump where at least some of the code values equal the jump value plus M, M being a selected integer;
   grouping the codes into groups of three adjacent codes and calculating a single compression number for each group according to the formula:

$$\text{Compression number} = N[N(\text{Code 3}) + \text{Code 2}] + \text{Code 1}$$

where $N = 2(M+1)$ and Codes 1, 2 and 3 are three adjacent code values of a group;

storing at least the compression numbers as compressed data; and reading the compressed data and selectively utilizing the stored compression numbers to determine codes 1, 2 and 3 of each group.

3. The method of claim 2 further comprising:

assigning a code value of $2M+1$ to each jump having an absolute value of greater than M;

for each jump having an absolute value greater than N, storing in the compression data after the compression number the actual jump value;

after the compression number has been utilized to determine codes 1, 2 and 3, determining the jump values from each code having a value of less than 2M plus one and reading the compression data stored after the compression number to determine the value of the jumps corresponding to each code in a group having a value of $2M+1$.

4. The method of claim 2 wherein said reading and utilizing step further comprises:

dividing the compression number by N to determine a first whole number quotient and a first remainder;

defining the first remainder as code 1;

dividing the first whole number quotient by N to find a second whole number quotient and a second remainder;

defining the second remainder as code 2;

defining the second whole number quotient as code 3.

5. The method of claim 2 wherein M equals two.

6. The method of claim 2 further comprising:

if all three jumps in a group of three have an absolute value of greater than M, generating a compression word as determined by the following formula:

$$\text{Compression word} = K[K(\text{Code 3}) + \text{Code 2}] + \text{Code 1}$$

where the code values are assigned according to the following formulas:

$$\text{Code value} = \text{Jump Value} + K/2 - M$$

for positive jumps and $$\text{Code value} = \text{Jump Value} = K/2 + M$$

for negative jumps;

storing a flag number in the compression data to indicate the presence of the compression word in the data;

storing the compression word after the flag number;

recognizing the flag number to indicate the presence of a compression word following the flag number;

reading the next two bytes after the flag number as the compression word;

dividing the compression word by K to determine a first whole quotient and a first remainder;

defining the first remainder as code 1;

dividing the first whole quotient by K to determine a second whole quotient and a second remainder;

defining the second remainder as code 2; and defining the second whole quotient as code 3.

7. The method of claim 6 where K equals forty and M equals two.

8. The method of claim 2 further comprising:

storing the compression number Q when all three jumps in a group of three are equal to zero;

scanning the stored data to locate compression numbers having a value of Q;

counting the number of adjacent compression numbers having a value of Q;

when two or more adjacent compression numbers have a value of Q, replacing the first of said compression numbers with a value of R to serve as a flag;

deleting from the compression data the adjacent compression numbers having a value of Q; and storing data after the R value in the compression data to specify the count of consecutive Q values that were encountered in the compression data.

* * * * *